US 9,502,995 B2

(12) United States Patent
Najafi et al.

(10) Patent No.: US 9,502,995 B2
(45) Date of Patent: Nov. 22, 2016

(54) MICRO-HYDRAULIC DEVICE

(71) Applicant: The Regents of the University of Michigan, Ann Arbor, MI (US)

(72) Inventors: Khalil Najafi, Ann Arbor, MI (US); Mahdi Sadeghi, Ann Arbor, MI (US); Rebecca L. Peterson, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 353 days.

(21) Appl. No.: 14/096,409

(22) Filed: Dec. 4, 2013

(65) Prior Publication Data

US 2014/0224656 A1    Aug. 14, 2014

Related U.S. Application Data

(63) Continuation-in-part of application No. 14/064,098, filed on Oct. 25, 2013.

(60) Provisional application No. 61/733,206, filed on Dec. 4, 2012.

(51) Int. Cl.
*G01M 3/02* (2006.01)
*H02N 11/00* (2006.01)
*B81B 3/00* (2006.01)

(52) U.S. Cl.
CPC ............. *H02N 11/00* (2013.01); *B81B 3/0021* (2013.01)

(58) Field of Classification Search
CPC .. G01P 15/125; H01L 27/20; H01L 41/1136; H01L 37/00; H01L 41/08; H01L 29/66007; B81B 3/0021; B81B 7/0009; B81B 7/0029; B81B 2201/0257; B81B 2203/0118; B81B 2203/0127; H02N 11/00; F15B 7/00; F15B 15/10; Y10T 29/42; Y10T 29/49156; Y10T 29/49155; H04R 19/04; H04R 19/005; G01L 9/0073; G01L 9/0075; G01L 19/0636; G01L 9/0072; B60C 23/0408
USPC ................ 73/37, 514, 514.32, 46, 715, 754; 204/601; 310/306; 381/174
See application file for complete search history.

(56) References Cited

U.S. PATENT DOCUMENTS

| | | | | |
|---|---|---|---|---|
| 6,156,585 A | * | 12/2000 | Gogoi | ............... G01L 9/0073 438/48 |
| 2003/0068231 A1 | * | 4/2003 | Cabuz | .................. F04B 43/025 417/53 |
| 2008/0072683 A1 | * | 3/2008 | Liu | ...................... B81B 3/0021 73/774 |

OTHER PUBLICATIONS

Madhi Sadeghi, Hanseup Kim, Khalil Najafi, Electrostatically Driven Micro-Hydraulic Actuator Arrays, 2010, IEEE, pp. 15-18.*

*Primary Examiner* — Lisa Caputo
*Assistant Examiner* — Brandi Hopkins
(74) *Attorney, Agent, or Firm* — Dierker & Kavanaugh, P.C.

(57) ABSTRACT

A micro-hydraulic device includes an enclosure. The enclosure includes a substrate having a first surface and a second surface distal to the first surface. The enclosure further includes a chamber defined between the first surface and the second surface. The chamber is defined by a wall substantially from the first surface to the second surface. The enclosure includes a first flexible membrane sealingly connected to the first surface and disposed over the chamber; and a second flexible membrane sealingly connected to the second surface disposed over the chamber distal to the first flexible membrane. The device further includes an internal fluid retained within the enclosure and a rigid electrode fixed within the chamber having an aperture therein. A flexible electrode is disposed on the second flexible membrane opposite the rigid electrode.

24 Claims, 11 Drawing Sheets

$$\text{Volume} \quad \pi \left( \frac{D^2 + 4h^2}{D^2} \right) \times \left[ \frac{1}{3} \left( \frac{D^2 - 4h^2}{D^2 + 4h^2} \right)^3 - \left( \frac{D^2 - 4h^2}{D^2 + 4h^2} \right) + \frac{2}{3} \right]$$

$$\text{if } D \gg h \longrightarrow \text{Volume} \cong \frac{\pi}{8} hD^2$$

$$\text{Capacitance} \quad \pi\varepsilon \, \frac{D^2 + 4h^2}{4h} \, \ln\left( \frac{g_0 + h}{g_0} \right)$$

MICRO-HYDRAULIC DEVICE

CROSS-REFERENCE TO RELATED APPLICATIONS

This application claims the benefit of U.S. Provisional Application Ser. No. 61/733,206, filed Dec. 4, 2012, which is incorporated by reference herein. This patent application is also a continuation-in-part of co-pending U.S. patent application Ser. No. 14/064,098, filed on Oct. 25, 2013, which is incorporated by reference herein.

STATEMENT REGARDING FEDERALLY SPONSORED RESEARCH OR DEVELOPMENT

This invention was made with government support under W911NF-08-2-0004 awarded by the U.S. Army Research Office. The government has certain rights in the invention.

BACKGROUND

Some examples of applied micro electro mechanical systems (MEMS) include inertial sensors, accelerometers, miniature robots, microengines, locks, micro actuators, optical scanners, fluid pumps, transducers, and chemical, pressure and flow sensors. The United States Army Research Laboratory's MAST (Micro Autonomous Systems & Technology) program is, in part, tasked with developing sensors for dynamic robot control, mapping and navigation, and situational awareness in micro-autonomous systems. For some applications, such as directional air flow or wind-gust detection, there are no known parts available even if size and weight constraints of the MAST program are relaxed.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Examples of the present disclosure may be applied as sensors for dynamic robot control, mapping and navigation, and situational awareness in micro-autonomous systems. Examples of the present disclosure include sensors with high speed, small size, high resolution, low power and wide dynamic range. Some sensors of the present disclosure, described as "hair structures" herein, include arrays of high aspect ratio, three-dimensional structures, with mechanical amplification of movement and local neural (i.e., electronic) integration.

Hair structures of the present disclosure are very effective in measuring air flow speed and direction. Since the tall hair structure is oriented out of the substrate plane, a small sensor footprint is possible, enabling sensor arrays which provide redundancy and fault tolerance. Some existing bio-mimetic hair-like sensors with piezoresistive or capacitive transduction for air flow sensing have very fragile structures with exposed delicate electronic elements which limit their use. These existing hair-like sensor designs also exhibit a trade-off between high accuracy and large dynamic range. For instance, for a conventional capacitive sensor, a narrow capacitive gap is needed to make the device sensitive to small plate deflections and thus obtain high sensitivity. However, narrow gaps may deteriorate the available sensor range. Examples of the present disclosure have sensors with improved sensitivity with better range.

Hydraulic structures may be used in many systems to amplify force or deflection. A hydraulic structure may include an incompressible liquid filling two connected chambers. Unequal surface areas of two movable pistons/membranes capping the chambers may contribute to amplification of either force or deflection. It is to be understood that a chamber may be defined by a pocket in the substrate with a flexible membrane cap, or a chamber may be defined by a fluid-filled bubble in the membrane on a flat portion of the substrate (without a pocket or relief in the substrate).

Figure 1:
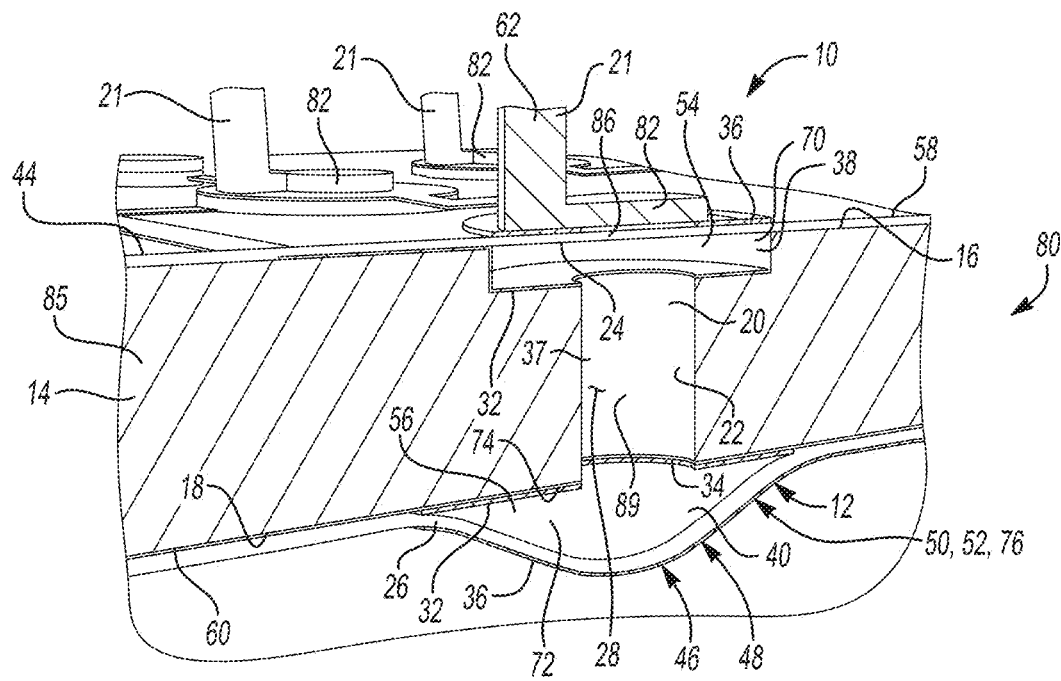
FIG. 1 is a semi-schematic diagram depicting a micro-hydraulic device according to the present disclosure.

FIG. 1 depicts an example of a micro-hydraulic device 10 according to the present disclosure. An enclosure 12 has a substrate 14 with a first surface 16 and a second surface 18 distal to the first surface. A chamber 20 is defined between the first surface 16 and the second surface 18. The chamber 20 is partially defined by a wall 22 substantially from the first surface 16 to the second surface 18. As used herein, "wall 22 substantially from the first surface 16 to the second surface 18" means that the wall 22 reaches from the first surface 16 to the second surface 18, or very nearly reaches from the first surface 16 to the second surface 18. In the example depicted in FIG. 1, a first pocket 38 is defined in the first surface 16, thereby preventing the wall 22 from reaching all the way to the first surface 16. It is to be understood that the chamber 20 includes the first pocket 38. A first flexible membrane 24 is sealingly connected to the first surface 16 and disposed over the chamber 20. A second flexible membrane 26 is sealingly connected to the second surface 18 disposed over the chamber 20 distal to the first flexible membrane 24. An internal fluid 28 is retained within the enclosure 12. A rigid electrode 32 is fixed within the chamber 20. The rigid electrode defines at least one aperture 34. A flexible electrode 36 is disposed on the second flexible membrane 26 opposite the rigid electrode 32.

FIG. 1 depicts a first pocket 38 in the substrate 14 with a first flexible membrane 24 cap, and a boss 82 at the top 44 of the device 10. The first flexible membrane 24 may collapse against the substrate 14 as long as the internal fluid 28 may exert pressure on the first flexible membrane 24. As disclosed herein, an application of hydraulic (or similarly pneumatic) systems in microstructures may enhance performance of MEMS devices. In examples of the present disclosure, a force applied to a large-side membrane (e.g., the second flexible membrane 26 in FIG. 1) may generate a pressure in the chamber 20. The chamber 20 pressure and internal fluid 28 movement will cause a small-side membrane (e.g., the first flexible membrane 24 in FIG. 1) to deflect by an inverse proportion to a surface area ratio of the membranes (e.g., 26 and 24). Some micro-scale hydraulic systems may amplify deflection or forces generated by an actuation source that is external to the hydraulic system, for example a piezoelectric actuator (not shown). Examples according to the present disclosure integrate an electrostatic element 48 to a micro-hydraulic system to form a micro-hydraulic device 10 that may be used for high performance sensing and actuation.

In examples of the present disclosure, the micro-hydraulic device 10 may be, or include sensors and actuators. In examples, the micro-hydraulic device 10 may have a core 46 that is a fluid-filled, enclosed micro-hydraulic structure 80 with a first hydraulic volume 54 hydraulically connected to a second hydraulic volume 56 with movable parts on each hydraulic volume 54, 56. The examples have a first aspect 58 corresponding to the first hydraulic volume 54 and the first surface 16; and a second aspect 60 distal to the first aspect 58 corresponding to the second hydraulic volume 56 and the second surface 18. In examples, the electrostatic element 48 may include integrated electrode pairs 50 to form a fluidic gap capacitor 52 for sensing and/or actuation.

Examples may further include an appendage 62 added on the first aspect 58, the second aspect 60, or both the first and the second aspects 58, 60 of the micro-hydraulic device 10. In a sensing configuration, appendage 62 may convert physical parameters (i.e., physical stimulation including force, flow, inertial movement, rotation, etc.) to applied pressure on the movable portions of the micro-hydraulic device 10 that can be detected by a transducing element. In examples configured as an actuator, the appendage 62 may move in response to the pressure changes in the hydraulic volumes 54, 56. The appendage 62 may move to implement a locomotion pattern (e.g., similar to the coordinated movement of oars by a rowing crew, legs or wings of an insect, or motile cilia in a human trachea, etc.). In examples, the locomotive pattern may cause the micro-hydraulic device 10 to move. In other examples, the locomotive pattern may cause movement of matter relative to the device 10 (e.g., a current of a fluid, gas or particles may be induced by the locomotive pattern, or the locomotive pattern may move a micro-lever to actuate a switch, valve, etc.). The appendage 62 may include a fluid-filled cavity (not shown), and the fluid in the fluid filled cavity may or may not be in fluid communication with the internal fluid 28 in the core 46.

Transducing elements may be embedded within or formed outside of the micro-hydraulic structure 80 to convert a non-electrical parameter of interest to an electrical signal or convert an electrical signal to a non-electrical signal that might be used for actuation. Electronic circuits may be located underneath/adjacent the micro-hydraulic structure 80 to condition an output signal of the transducing element to modify sensitivity and selectivity when the micro-hydraulic device 10 is configured as a sensor or to modify actuation performance when the micro-hydraulic device is configured for actuation.

As disclosed herein, an array 64 of the micro-hydraulic devices 10 may be formed on the same substrate 14 to provide, for example, fault tolerance, redundancy, and improved performance including better sensitivity or wider dynamic range, or to allow the measurement of different parameters by elements 66 of the array 64. Each of the micro-hydraulic devices 10 and appendages 62 in an array 64 may be formed from different materials so the elements 66 of the array 64 may be responsive to different parameters in sensing configurations, or generate different non-electrical signals in actuating configurations. Signal processing and control electronics may be integrated with the array or connected as a hybrid device to process the output the array 64 to extract useful information. For example, a single micro-hydraulic device 10 may sense the speed of a fluid flow, whereas an array 64 of slightly different micro-hydraulic devices 10 may provide both speed and direction of the fluid flow.

Figure 11:
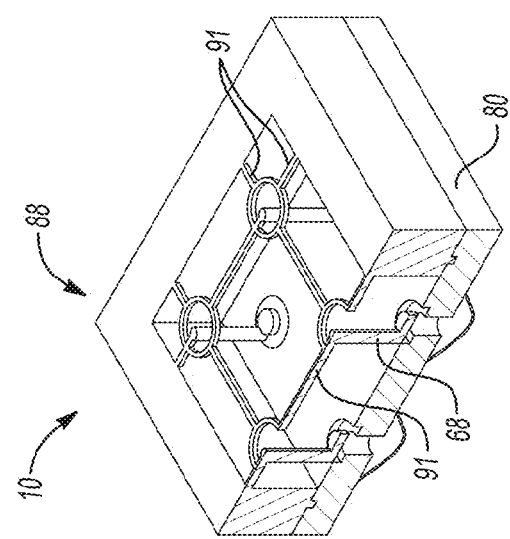
FIG. 11 semi-schematically depicts an example of a micro-hydraulic structure, an example of an integrated hair-boss and support rim, and an example of insertion of the integrated hair-boss over the micro-hydraulic structure.
Figure 11:
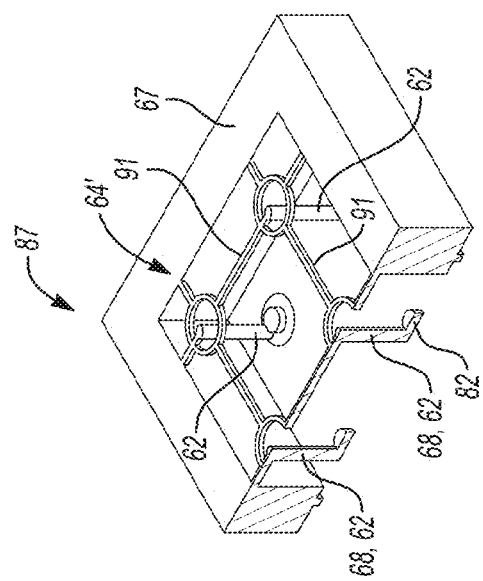
Figure 11:
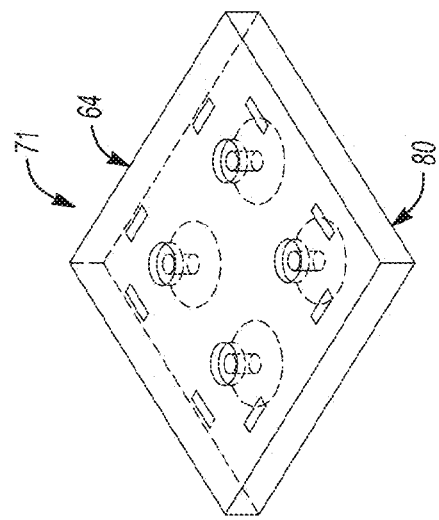

Referring to FIG. 11, examples of the present disclosure may include a plurality of the micro-hydraulic devices 10 arranged in an array 64. The micro-hydraulic devices 10 arranged in the array 64 may have a common substrate 14, or the individual substrates 14 may be different. The appendages 62 may be arranged in a corresponding array 64' to align with the array 64. As used herein, an array 64, 64' includes a plurality of micro-hydraulic devices 10 or appendages 62. The arrangement of the array 64, 64' may be in rows and columns, in a circle, in a star-shape, or another arrangement which may or may not form a regular pattern. The appendages 62 in an array 64' may be connected by rigid joining or by a flexible layer. At least one device 10 in the plurality of the devices 10 in the array 64 may be different from another device 10 in the plurality of the devices 10. As used herein, "different" means substantially distinct and more than separate instances of substantially identical devices 10. For example, one device 10 may encapsulate silicone fluid, while another device 10 may encapsulate air. In another example, a device 10 may be larger or smaller than another device 10, the appendages 62 may have substantially different shapes, materials, directional orientation, etc.

In examples according to the present disclosure, a micro-hydraulic structure 80 may be used to expand a measurement range while maintaining the same sensitivity compared to a transducer that is not enhanced by the micro-hydraulic structure 80. An example of a capacitive sensor enhanced by a micro-hydraulic structure 80 is shown in FIG. 1. A large gap 70 may be used on a front side 58 (corresponding to the first aspect 58) to allow a large range, while a narrow gap 72 may be used on the back side 60 (corresponding to the second aspect 60) to obtain high sensitivity. Due to the asymmetric nature of the micro-hydraulic structure 80, a larger capacitive plate area 74 on the back side 60 can compensate for the smaller deflection on the back side 60. In addition, since both the large gap 70 and the narrow gap 72 are filled with the internal fluid 28 and enclosed, the micro-hydraulic device 10 is robust and less prone to damage in wet, windy or dusty environments compared to capacitive sensors with exposed capacitive gaps or piezoresistive sensors with narrow and fragile cantilever beams. Moreover, the capacitive transducer of the present disclosure is a passive transducer that consumes relatively low power compared to hot wire anemometers or other thermal sensors where there is a sensing element that must be heated, actively consuming power.

As disclosed herein, examples of sensors may be made without an appendage 62 connected to the flexible membrane 24, 26. For example, a mass of the internal fluid 28 may be used as an inertial mass in an example configured to sense acceleration. A solid mass may be connected to either the first flexible membrane 24, the second flexible membrane 26 or to both flexible membranes 24, 26 in another example configured to sense acceleration. The solid mass may be connected either internally or externally to the flexible membrane 24, 26.

Other examples disclosed herein may detect a change in capacitance caused by a change in the dielectric constant of the internal fluid 28. For example, a micro-hydraulic device 10 may be configured as a temperature transducer by having an internal fluid 28 that changes a dielectric constant in response to temperature. In examples, a pressure in the internal fluid 28 may be responsive to temperature. Changes in the pressure may cause a deflection of the flexible membrane 24, 26 that may be detected by measuring the capacitance of the capacitor 76 having at least one flexible electrode 36 disposed on the flexible membrane 24, 26. External pressure may be applied to the first aspect 58, the second aspect 60, or both aspects 58, 60 of the micro-hydraulic structure 80. In addition to the deflective anemometer configurations of examples of the present disclosure, fluid flow may be determined as it relates to dynamic pressure. In such an example, fluid flow may be directed at or over the flexible membrane 24, 26 to cause a pressure that may be detected as a capacitance. Pressurized fluid may also be connected to the flexible membrane 24, 26. In examples of the present disclosure, atmospheric pressure may be detected.

The internal fluid 28 may be an incompressible fluid or a compressible fluid. Some non-limitative examples of incompressible fluids are silicone oil, and water. Some non-limitative examples of compressible fluids are air and nitrogen. The internal fluid 28 may be a mixture of fluids. Further, the internal fluid 28 may be a dispersion of solid particles in a liquid. For example, nano-particles may be suspended in a liquid. The internal fluid 28 may be electro-chemically active. An example of an internal fluid 28 with an electro-chemically active property may be an electrorheological fluid that changes viscosity in an electric field. Another electro-chemically active fluid may have a dielectric constant responsive to pressure or the presence of a predetermined chemical. Another example of the internal fluid 28 may change state from liquid to solid or gas. The internal fluid 28 may be a gel.

Examples of the present disclosure advantageously achieve relatively high bandwidth and sensitivity with a large dynamic range. A response time of the micro-hydraulic device 10 disclosed herein may be at least partially constrained by fluidic resistance of the internal fluid 28. Contributors to the fluidic resistance in examples of the micro-hydraulic devices 10 of the present disclosure have been discovered, and the sensor bandwidth, sensitivity and range of the devices 10 have been co-optimized. For instance, the example of the sensor depicted in FIG. 9 may achieve a higher bandwidth compared to a bandwidth achievable by the example depicted in FIG. 3. Bandwidth may be further increased by using lower viscosity internal fluids 28 such as water, other types of silicone oils, etc.

FIG. 1 depicts an example of a micro-hydraulic capacitive air flow hair sensor according to the present disclosure. The micro-hydraulic device 10 has hair-like posts 21 attached on a bossed membrane 86. After integration of the boss 82, a silicone elastomer epoxy, for example, may be used to attach the tall hair (appendage 62) over the boss 82. The micro-hydraulic structure 80 in FIG. 1 includes a first hydraulic volume 54 hydraulically connected to a second hydraulic volume 56. on the front side 58 and back side 60 of a silicon wafer 85 connected by a channel 89. Both hydraulic volumes 54, 56 and the channel 89 are filled with an internal fluid 28 (e.g., silicone oil); and the hydraulic volumes 54, 56 are capped by a Parylene membrane 24, 26 to enclose the micro-hydraulic structure 80. In the example depicted in FIG. 1, the thickness of the Parylene membrane 24,26 is about 1-2 µm. In other examples, the Parylene membrane 24, 26 may be thicker or thinner. Either hydraulic volume 54, 56 may be compressed by applying pressure to the flexible Parylene membrane 24, 26 on one side, thus forcing the internal fluid 28 into the other hydraulic volume 54, 56, causing the respective membrane 24, 26 to deflect. Amplification of either force or displacement is achievable depending on the area ratio between the hydraulic volumes 54, 56. This amplification exhibited by examples of the micro-hydraulic structure 80 of the present disclosure, may advantageously improve sensor performance. A pair of electrodes 32, 36 on the either side (front side 58, back side 60 or both) may be used for electrostatic actuation or capacitive sensing.

Figure 2A:
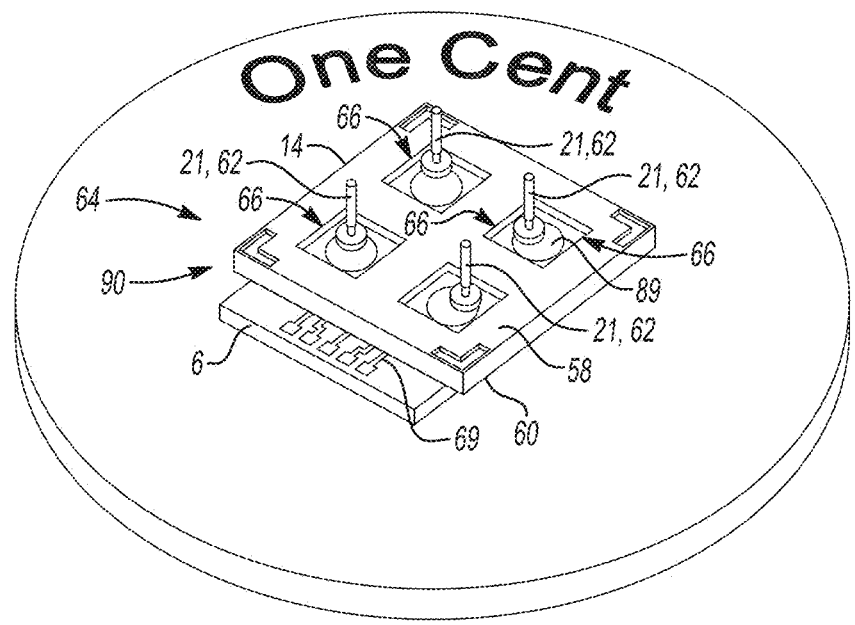
FIG. 2A depicts an example of a micro-hydraulic device according to the present disclosure with an array of hair-like posts attached on top of a 4-cell micro-hydraulic structure, shown to convey size relative to a U.S. penny.

In an example, a hair-like post 21 may be used to convert drag force caused by flow of an environmental fluid, (e.g., air, water, etc.) into pressure that is applied on the first flexible membrane 24. In an example, the hair-like posts 21 may be attached to the first flexible membrane 24 with silicone elastomer epoxy. FIG. 2A shows an array of four hair-like posts 21 arranged for sensing flow speed and direction. The example of the present disclosure depicted in FIG. 2A offers a large air flow speed measurement range, high sensitivity and high bandwidth, e.g., of about 30 Hz to about 70 Hz. The example responds linearly to increasing flow speed from 0 to 15 m/s. The sensitivity is estimated to be slightly over 2 cm/s. It is to be understood that the micro-hydraulic arrays 90 may also be made via batch fabrication.

Figure 2B:
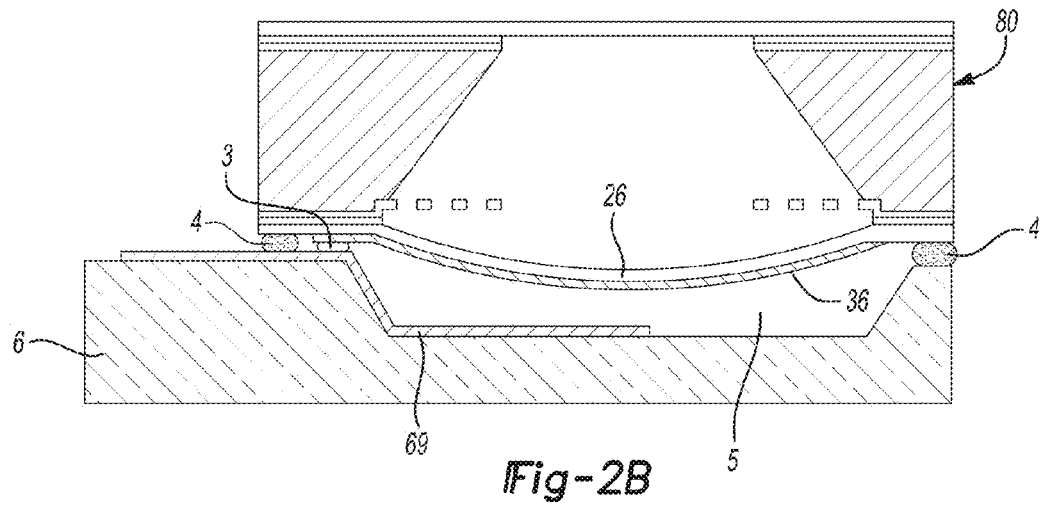
FIG. 2B is a semi-schematic cross-section depicting the mounting of the micro-hydraulic structure shown in FIG. 2A.

FIG. 2B is a semi-schematic cross-section depicting the mounting of the micro-hydraulic structure 80 from FIG. 2A. The micro-hydraulic structure 80 is mounted on a glass interposer 6, which is a glass substrate that is recessed in selected areas to protect the second flexible membrane 26 and provide interconnections via the network of electrical conductors 69 disposed on the glass interposer 6. Conductive epoxy provides an electrical connection between the flexible electrode 36 and the electrical conductors 69. Non-conductive epoxy 4 is used to provide mechanical enforcement to attach the micro-hydraulic chip to the glass substrate. The recesses 5 are deep enough to allow the second flexible membranes 26 to fully deflect at the full-scale force range. Using the glass interposer 6, direct wire bonding to the micro-hydraulic structure 80 is made possible; wire bonding cannot be performed on substrates with parylene coating. Further, the glass interposer 6 reduces parasitic capacitance due to running long metal traces on the glass instead of the thin parylene membrane.

Figure 3:
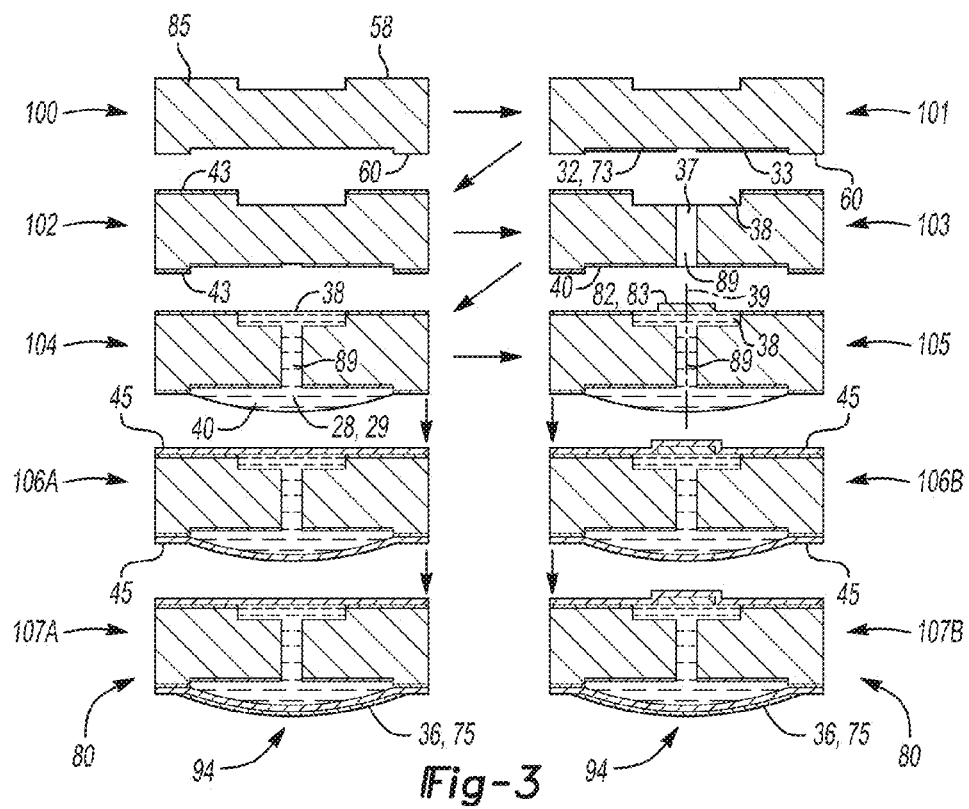
FIG. 3 depicts an example of a fabrication process according to the present disclosure.

FIG. 3 depicts fabrication steps of an example micro-hydraulic structure 80 according to the present disclosure. At reference numeral 100, FIG. 3 starts with Deep Reactive Ion Etching (DRIE) trenches on the front side 58 and back side 60 of a silicon wafer 85. At 101, a stack of evaporated Cr/Au films 33 on the back side 60 forms the rigid electrode 32 first capacitive plate 73 of the capacitive sensor 94. It is to be understood that the first capacitive plate 73 may also be part of an actuator. In the next step 102, Cytop™ (Cyclic Transparent Optical Polymer) 43, a hydrophobic polymer, is spun and patterned on both the front side 58 and back side 60 of the silicon wafer 85. Cytop™ 43 makes the surface hydrophobic, helping to contain liquid droplets in Cytop™-free areas. At 103, a channel 89 connecting the first pocket 38 and the second pocket 40 is made using DRIE. At 104, the internal fluid 28, (e.g., a silicone oil 29), is dispensed, and, with help of the Cytop™ 43, the silicone oil 29 is contained only in the first pocket 38, the second pocket 40, and the channel 89. In examples of the present disclosure, a boss may or may not be included (as described in the following section) at step 105. The process is depicted having two branches, denoted A and B in FIG. 3. The A branch shows the process without a boss; and the B branch shows the process with a boss. At 106A and 106B, the whole structure shown is encapsulated with Parylene 45. Since the silicone oil 29 used in this particular example (1,3,5-trimethyl-1,1,3,5,5-pentaphenyltrisiloxane) has very low vapor pressure, it is not evaporated during deposition of the Parylene 45 in a vacuum chamber, and surface tension keeps the silicone oil 29 in place. An example of a silicone oil used here has CAS #3390-61-2 and may be purchased from Gelest Inc., Morrisville, Pa. Examples of other low vapor pressure fluids include: Krytox® brand fluid, which may be purchased from DuPont; Fomblin brand fluid, which may be purchased from Solvay Solexis; etc. Other liquids may also be used within the micro-hydraulic structure 80. At 107A/107B, a layer of Cr/Au is deposited through a shadow mask onto the Parylene 45 to form the flexible electrode 36, which is the second capacitive plate 75.

Figure 4:
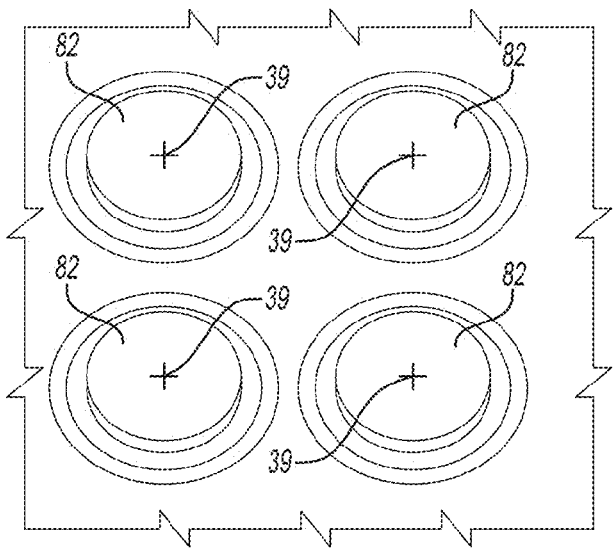
FIG. 4 depicts an example of a bossed top membrane according to the present disclosure.

According to an example of the present disclosure, to make a hair-like air flow sensor or actuator including the micro-hydraulic structure 80, an appendage 62 (e.g., a hair-like post 21) may be attached to the first flexible membrane 24 to translate the ambient air flow into hydraulic pressure. The appendage 62 is attached to allow transduction without altering the rest of the micro-hydraulic structure 80. A technique to integrate a silicon boss 82 as a platform for attaching the appendage is disclosed herein. As shown in FIG. 3 at 105, 106B, and 107B, after liquid dispensing 104, a silicon disk 83 having a thickness of about 100 μm, (i.e., a boss 82), is put over the internal fluid 28 before the Parylene 45 is deposited 106B. The silicon disk 83 does not sink into the silicone oil 29. The silicon disk 83 rests in a substantially flat position and is aligned in a center 39 of the first pocket 38 due to surface tension. FIG. 4 shows an example in which the boss 82 does not sink into the internal fluid 28 and is self-aligned in the center 39.

It is to be understood that examples of a boss 82 according to the present disclosure are not limited to the flat or disk-like shape shown in FIG. 4. For example, the boss 82 may be square shaped, star shaped, oval shaped, etc. (not shown). The boss 82 may be solid, or may have perforations like a net, grid, or web (not shown). In examples of the present disclosure, the boss 82 is more rigid than the membrane 24, 26 to which it is attached or connected.

Figure 5:
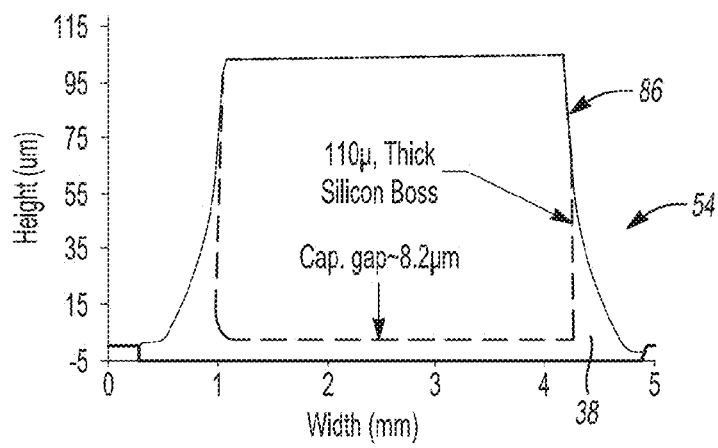
FIG. 5 depicts a surface profile of a first hydraulic volume with a bossed membrane over a first pocket.
Figure 6:
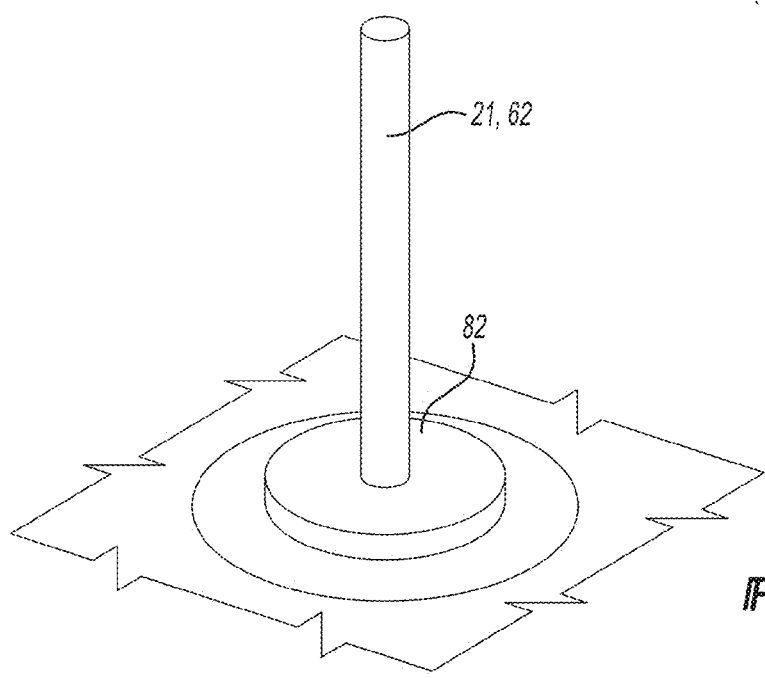
FIG. 6 depicts a hair-like post in which the hair-like post is attached to the first flexible membrane over the boss according to an example of the present disclosure.

According to an example of the present disclosure, after boss integration, a pre-fabricated hair-like post 21 may be attached to the boss 82 in a minimally invasive way without excessive adhesive/paste reflow or residues which might alter the membrane 24, 26 mechanical properties. FIG. 6 shows a hair-like post 21 attached to a boss 82. An air flow sensor made by attachment of a hair-like post 21 on a bossed membrane 86 has been successfully tested. It has been shown that the micro-hydraulic device 10 with a bossed membrane 86 obtains the same performance as a micro-hydraulic device 10 without a bossed membrane 86 while scaling down the device geometry by a factor of 2.5 in hair (appendage 62) length and a factor of 4 in capacitance area. FIG. 5 depicts a surface profile of a first hydraulic volume 54 with a bossed membrane 86 over a 4.5 μm first pocket 38.

It is to be understood that the hair-like post 21/appendage 62 and boss 82 may be integrated after respective production, or the hair-like post 21/appendage 62 and boss 82 may be constructed as a unitary whole.

Examples of the present disclosure may include an appendage 62 that is enclosed within the flexible membrane 24, 26. In other examples, the appendage 62 may be disposed external to the flexible membrane 24, 26 operably connected to the flexible membrane 24, 26. In some examples, a boss 82 may be intermediate to the appendage 62 and the flexible membrane 24, 26. In other examples, the flexible membrane 24, 26 may be disposed between the appendage 62 and the boss 82.

Figure 7:
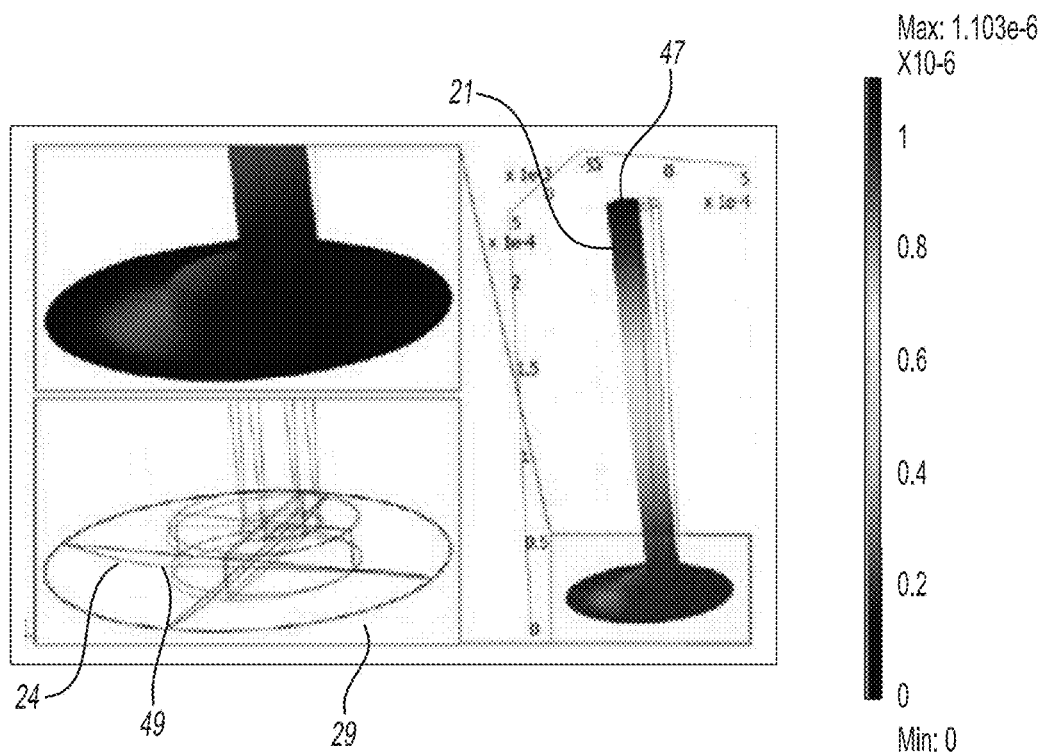
FIG. 7 depicts a simulation result of a membrane and hair structure deflected in response to air flow.
Figure 8:
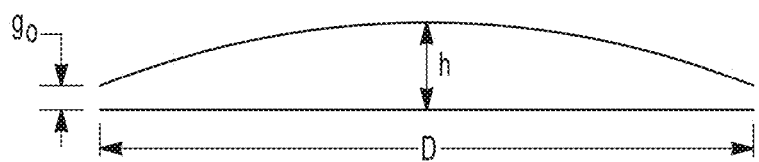
FIG. 8 depicts a cross-section of capacitive electrodes and equations used to calculate the capacitance change on the second aspect of an example of the present disclosure.

To verify the experimental results, the structural mechanics component in the MEMS module of COMSOL Multiphysics® was used to model the micro-hydraulic device 10 configured as air flow sensor. The dimensions of the device 10 used in the model are shown in Table I below. An example showing deflections of the simulated membrane and hair structure are shown in FIG. 7. Although some of the information in FIG. 7 is lost in the conversion from color to grayscale, it is still possible to notice that the hair-like post 21 acts as a lever, deflecting the membrane 24 somewhat like a drum-head would deflect on a larger scale. The drag force on the hair-like post 21 for a given air flow is analytically calculated. The resultant force is then applied to the tip 47 of the hair-like post 21 in COMSOL, which predicts the resultant deflection of the tip 47 and the 3-D membrane displacement 49. From the 3-D membrane displacement 49, the volume change under the first flexible membrane 24 is calculated. Assuming the silicone oil 29 is an incompressible fluid such that the entire liquid volume change is transferred to the second aspect 60 (see FIG. 1), the second flexible membrane 26 deflection is calculated. Using the capacitance-gap relation of a curved electrode capacitor, the expected change in back-side capacitance is determined. The back-side curved electrode geometry including a cross-section of the capacitive electrodes 32, 36 and the equations used to calculate the volume and capacitance between the curved electrode 36 and the flat electrode 32 are shown in FIG. 8. Note that the equations in FIG. 8 assume that the height h of the liquid droplet is much smaller than its diameter D.

It is to be understood that the boss 82 may be disposed on the same side of the micro-hydraulic device 10 as the capacitor 76. In such an example, the boss 82 may reduce the curvature of the flexible electrode 36 disposed on the flexible membrane 26, thereby increasing the base capacitance value with the same gap $g_0$ around the perimeter of the pocket 40. Increased base capacitance may increase the sensitivity and resolution of the sensor.

TABLE I

| Parameter | Value |
| --- | --- |
| Parylene membrane 24, 26 thickness | 1 μm |
| Front Parylene membrane 24 diameter | 1 mm |
| Back Parylene membrane 26 diameter | 2.24 mm |
| Hair-like post 21 height | 1.9 mm |
| Hair-like post 21 diameter | 220 μm |
| Boss 82 thickness 81 | 118 μm |
| Boss 82 diameter 84 | 474 μm |
| First pocket 38 depth | 4.5 μm |
| Second pocket 40 depth | 2 μm |

For the geometry of the device used in the model, simulation predicts that at 1 m·s$^{-1}$ of air flow (or 0.157 μN at the tip 47 of the hair-like post 21), the tip 47 of the hair-like post 21 will be deflected by 1.103 μm. This deflection is amplified in the plot of FIG. 7 by a factor of 128.5 in order to make it visible. The deflection of the hair-like post 21 causes a first flexible membrane 24 deflection of 300 nm and a volume change of 6.28×10$^{-14}$ m$^3$ under the first flexible membrane 24. This corresponds to a predicted maximum second flexible membrane 26 deflection of 32 nm resulting in a capacitance change of 150 fF. This is of the same order of magnitude as the measured result of 230 fF capacitance change for 1 m·s$^{-1}$. Differences between the experimental and simulation results may come from uncertainty in calculations of the fluid drag force and drag coefficient at very low flow speeds (i.e., at low Reynolds' number) and from non-idealities of the fabricated device, including slight curving of the first flexible membrane in the hardware model. Note the ~10× hydraulic amplification ratio between the first flexible membrane 24 and second flexible membrane 26 deflection (300 nm vs. 32 nm). Table II summarizes the results below.

TABLE II

| Simulation results and experimental data | |
| --- | --- |
| Maximum deflection of the first flexible membrane | 300 nm |
| Liquid volume transfer | 6.28 × 10$^{-14}$ m$^3$ |
| Maximum deflection of the second flexible membrane | 32 nm |
| Back side 60 capacitance change (Modeling) | 150 fF |
| Back side 60 capacitance change (Measured) | 230 fF |

Although the example depicted in FIG. 6 includes a column-shaped appendage 62, it is to be understood that other shapes may be used to give different drag characteristics. By way of example and without limitation, the appendage 62 may be shaped as a sail, a mushroom, a chevron, a T, an X, a square, a rectangle, or a cylinder and combinations thereof.

Figure 9:
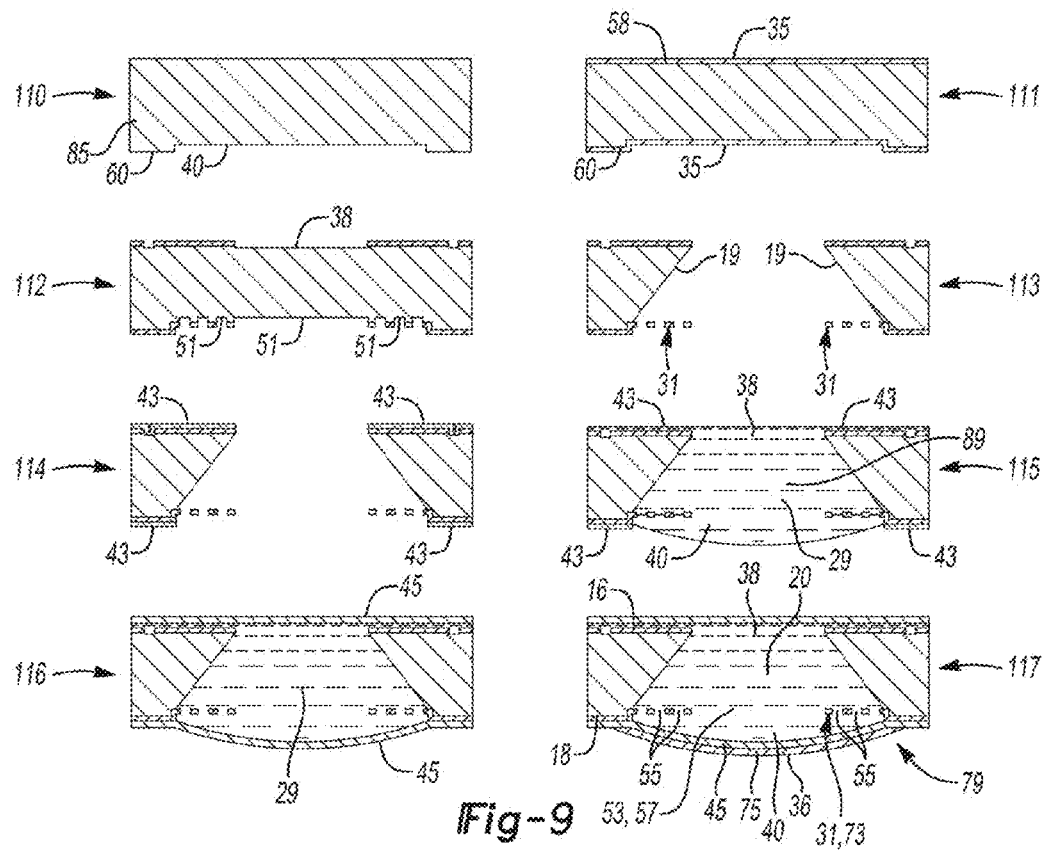
FIG. 9 depicts an example of a fabrication process according to the present disclosure.

An example of a fabrication process according to the present disclosure for a tapered wall micro-hydraulic sensor 79 is shown in FIG. 9. The process begins at reference numeral 110 by forming a DRIE pocket 40 on the second aspect 60 of the silicon wafer 85. To form a perforated rigid electrode 31, a deep (about 12 μm thick) blanket boron layer 35 is diffused on first aspect 58 and the second aspect 60 (reference numeral 111). At 112, in a second DRIE step, trenches 51 are etched on the second aspect 60. These trenches 51 define the perforated rigid electrode 31 which is formed such that the ethylene diamine and pyrocatechol (EDP)-etched inverted pyramids overlap. In this manner, substantially the whole silicon bulk near the perforated rigid electrode 31 is etched to realize the structure shown at the end of the process at reference numeral 117. It should be noted that the deep boron doped layer will not be etched in EDP. At 112, the front side DRIE trenches are also etched to form the first pocket 38. At 113, the first aspect 58 is protected with 0.5 μm LPCVD (Low Pressure Chemical Vapor Deposition) oxide, and by anisotropic etching of the silicon from the second aspect 60 with EDP, the floating perforated rigid electrode 31 and tapered wall 19 is realized. At 114, Cytop™ 43, a hydrophobic polymer, are applied and patterned on both the first aspect 58 and the second aspect 60 of the silicon wafer 85. The hydrophobic polymer helps to contain liquid droplets in Cytop™-free areas. At 115, the silicone oil 29 is dispensed, and, with help of the Cytop™ 43, it is contained only in the first pocket 38, the second pocket 40 and the channel 89. At 116, the whole structure shown is encapsulated with Parylene 45. Since the silicone oil 29 used in the example depicted in FIG. 9 (1,3,5-trimethyl-1,3,5,5-pentaphynyltrisiloxane) has very low vapor pressure, it is not evaporated during Parylene deposition in a vacuum chamber (reference numeral 116). At 117, Cr/Au metal is deposited through a shadow mask onto the top of the Parylene 45 layer to form the second capacitive plate 75.

In examples of the present disclosure, the perforated rigid electrode 31 may be a substantially rigid first capacitive plate 73. As used herein, substantially rigid means at least 10 times more rigid than the flexible electrode 36 that forms the second capacitive plate 75. To illustrate, in examples where the second capacitive plate 75 may deflect about 1 μm at a particular state of the sensor 79, the substantially rigid first capacitive plate 73 may deflect less than about 0.1 μm.

The perforated rigid electrode 31 depicted in FIG. 9 is shown having a central aperture 53 and a plurality of peripheral apertures 55. Examples of the present disclosure may include a single aperture 57 that may or may not be centrally located with respect to the chamber 20. Examples may include a plurality of apertures 57 with or without a central aperture 53.

The chamber 20 depicted in FIG. 9 between the first surface 16 and the second surface 18 has a tapered wall 19 defining a diverging cross-section from the first surface (16) to the second surface (18). The cross-section may have a round wall, an oval wall, or a wall having any number of sides. For example, the cross section may be square or hexagonal. The cross-sections may have different shapes as long as the shapes have the same cross-sectional area. For example, the cross section may be round at the opening near the first surface 16 and transition to a square with a larger cross-section at the opening near the second surface 18. In examples where a pocket 38, 40 is formed in the first surface 16 or the second surface 18, the chamber 20 may terminate with an opening into the pocket 38, 40.

In examples of the present disclosure not shown in FIG. 9, the chamber 20 may have cross-sections with a substantially constant cross-sectional area defined by a wall 22. For example, a cylindrical chamber 20 may be defined by a wall 22 in the substrate, similar to that shown in FIG. 1 and in FIG. 3. It is to be understood that the cylinder 37 may be a general cylinder, and not necessarily a circular cylinder (for example, it may be an elliptic cylinder). The cylinder 37 may be a right cylinder or oblique. The cross-section of the chamber 20 may have a round wall, an oval wall, or a wall 22 having any number of sides (for example, a triangle, rectangle, or hexagon). In examples of the present disclosure, the centroid of the cross sections may be aligned along a linear path between the first surface 16 and the second surface 18; however a curved path may be used. The chamber 20 may be helical with substantially constant cross-sections.

Figures 10A, 10B:
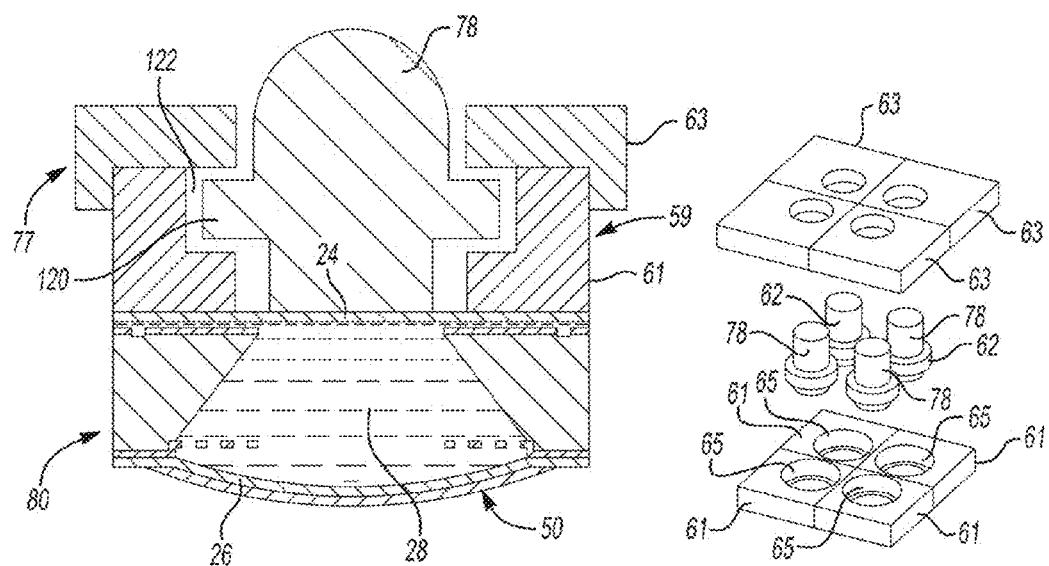
FIG. 10A depicts an example hydraulic structure with an interface tactile structure according to the present disclosure.
FIG. 10B depicts a 3-D arrangement of interface tactile parts according to an example of the present disclosure.

FIG. 10A schematically depicts an example of a micro-hydraulic structure 80 along with a tactile structure 77 including a plunger 78 according to the present disclosure. The plunger 78 contacts the Parylene first flexible membrane 24 of a micro-hydraulic structure 80, inside a protective casing 59 that may include a base 61 and a cap 63. FIG. 10B depicts a 3-D layout of arrays of the bases 61, plungers 78, and caps 63. Generally, a load on the plunger 78 causes deflection in the first flexible membrane 24 and pushes the internal fluid 28 to the second flexible membrane 26, which also deflects. The tactile plunger 78 is held in place by the protective casing 59. The protective casing 59 also protects the first flexible membrane 24 from permanently damaging amounts of deformation or rupture by limiting the motion of the plunger 78 to an allowed range of stress for Parylene deflection. In the example depicted in FIG. 10A and FIG. 10B, each plunger 78 has an individual isolated cavity 65, as shown in FIG. 10B, to eliminate cross-talk.

It is to be understood that the appendage 62 need not be firmly attached to the membrane 24 of the micro-hydraulic device 10. With a tactile plunger structure 77 as discussed above, the appendage 62 (plunger 78) is assembled to be near the membrane 24 without any adhesive or fastener holding the appendage 62 to the membrane 24. The plunger 78 is held in position only by the casing 59 (i.e., the base 61 and cap 63 as discussed above). As such, the appendage 62 is captivated by the device 10. As used herein, captivated means loosely held in an operative position in such a way that the captivated appendage cannot fall out of place. To illustrate the meaning of captivated, furniture kits may include captivated fasteners attached to certain pieces to allow easier assembly. In the example depicted in FIGS. 10A and 10B, the appendage 62 (plunger 78) has an annular flange 120 that cooperates with an annular recess 122 defined in the casing 59 by the base 61 and the cap 63 to loosely hold the appendage 62 (plunger 78) in an operative position in such a way that the plunger 78 cannot fall out. As such, in the example depicted in FIGS. 10A and 10B, the casing 59 is a captivating structure. The casing 59 is adhered to the substrate 14 containing the micro-hydraulic structure 80.

FIG. 11 depicts an example of a micro-hydraulic structure 80 at reference numeral 71; an example of an integrated hair-boss 68 and support rim 67 at 87; and an example of insertion of the integrated hair-boss 68 over the micro-hydraulic structure 80 at 88. Integration of the hair-boss 68 with the micro-hydraulic structure 80 may be done before or after Parylene coating according to the present disclosure. If inserted over the micro-hydraulic structure 80 before Parylene deposition, the hair-boss 68 will be attached without use of any epoxy/adhesive etc. However, after Parylene coating, a hair-boss adhesive may be used for attachment. After integration with either method, tethers 91 holding the hair-boss 68 in place may be severed using laser ablation or mechanically with a razor, precision knife, cautery etc. according to the present disclosure.

Figure 12A:
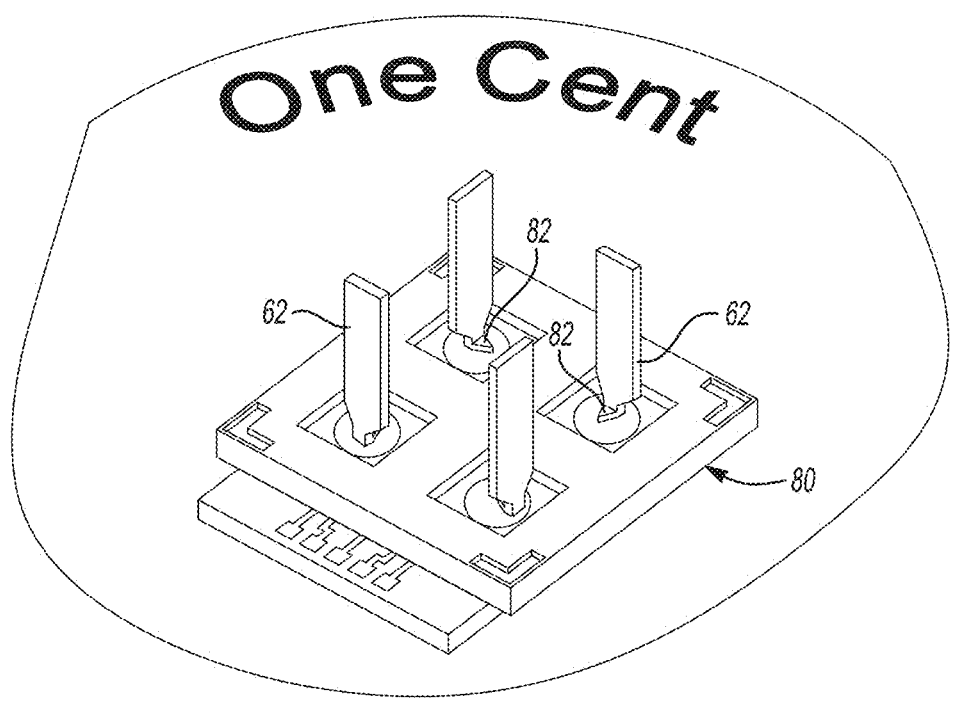
FIG. 12A depicts an example of integration of a separately fabricated micro-hydraulic chip and an integrated SLA (Stereolithography Apparatus) hair-boss.

FIG. 12A depicts an example resulting from separate fabrication of a micro-hydraulic structure 80 and an SLA framework according to the present disclosure. The SLA framework is an example of implementation of the support rim 67, tethers 91, and hair-bosses 68 shown at reference numeral 87 in FIG. 11 using stereo-lithography apparatus to fabricate 3D structures. FIG. 12A shows the SLA hair-bosses 68, however, the support rim and tethers are not shown. The SLA hair-bosses 68 may be attached with adhesive. In another example, Parylene may be deposited over the entire SLA framework to attach the hair-boss 68 to the micro-hydraulic structure 80. Trimming/cutting the SLA tethers 91 (see FIG. 11) releases the hair-boss 68 and yields the example shown in FIG. 12A. The device depicted in FIG. 12A may be used to sense flow speed and direction.

Figure 12B:
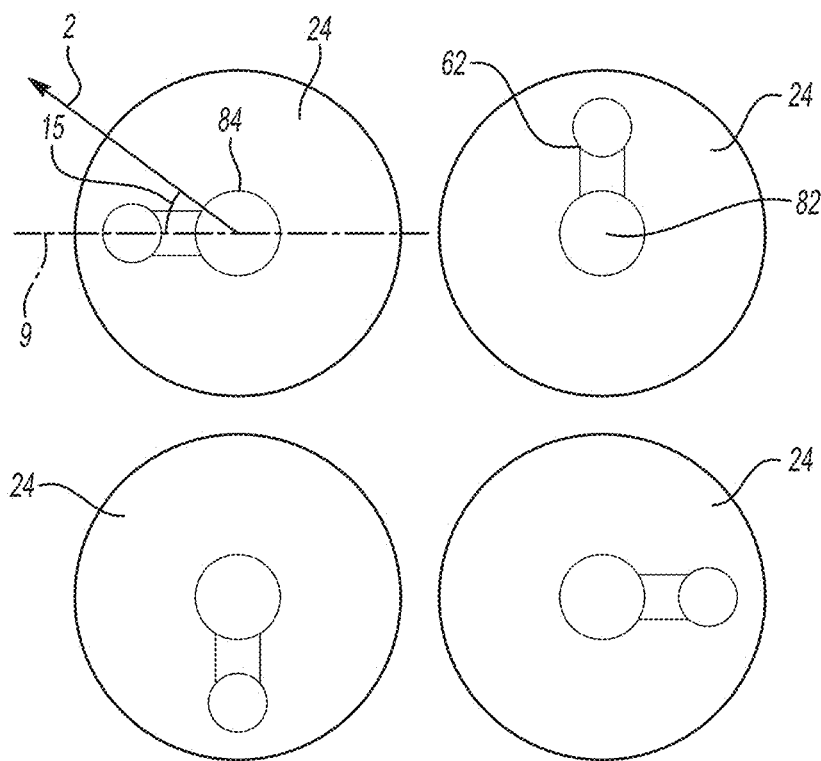
FIG. 12B is a semi-schematic plan view of the micro-hydraulic device depicted in FIG. 12A.

In the example depicted in FIG. 12A, off-center positioning of the hairs (appendages 62) makes their response asymmetrical to a flow angle 15. A COMSOL model is used to simulate the flow angle. FIG. 12B is a semi-schematic plan view of the micro-hydraulic device depicted in FIG. 12A. FIG. 12 B depicts certain parameters used in the COMSOL model. In the COMSOL model the hair-boss 68 is affixed on top of the Parylene membrane 24. The hair 62 is located at about 56% of a radius of the membrane 24 over the pocket 38, and the boss diameter 84 is kept constant at about 50 μm. The boss 82 is kept in the center of the membrane 24. In FIG. 12B, the flow vector 2 represents the magnitude and direction of flow; the flow vector 2 is not meant to convey a point of application of the force from flow. A point force is applied to the hair tip 47 and the application angle of the point force with respect to hair-to-boss axis is varied while the volume change under the parylene membrane 24 is calculated. This equivalently resembles the variation of the flow angle 15.

Figure 12C:
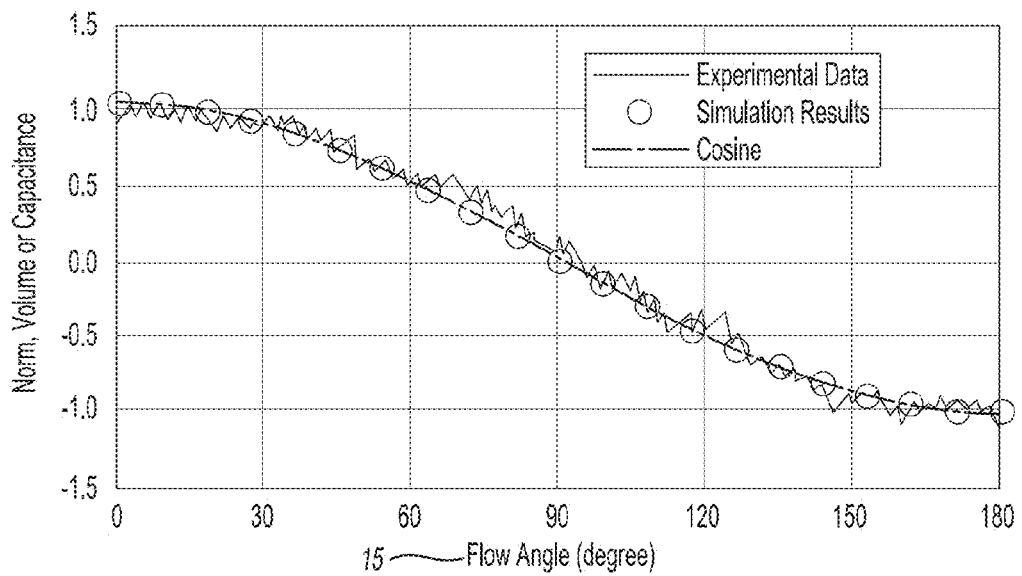
FIG. 12C is a graph comparing simulation and experimental results from the micro-hydraulic device depicted in FIG. 12A.

The results of the simulation described above are shown in FIG. 12C. FIG. 12C shows that, due to the asymmetry of the hair-boss 68 and the off-center position of the hair-boss 68, each hair air flow sensor (HAFS) measures a projection of the airflow along its hair-to-boss axis 9. Therefore, if two HAFSs are perpendicularly positioned, the air flow direction in the wafer plane can be quantified. Two mirrored HAFS allow differential measurements to mitigate sensor response to inertial movement, temperature variations, or other common mode signals, which may be desirable for applications on mobile platforms. Consequently, by orienting four HAFSs as schematically shown in FIG. 12B (and FIG. 12A), a 2-D airflow vector can be measured differentially.

For characterization of the directional sensitivity, the HAFS is fixed on top of a rate table and it is manually rotated while the hair sensor is fully immersed inside a constant speed laminar air flow. The normalized response of the sensor, which shows an angular resolution of about 13°, is plotted in FIG. 12C alongside simulation data. In this FIG. 12C, the simulation results refer to normalized volume change under the parylene membrane 24 as the flow angle 15 varies. The noise in the experimental data plotted in FIG. 12C may be partially due to vibration or instability of the rotation stage.

Figure 12D:
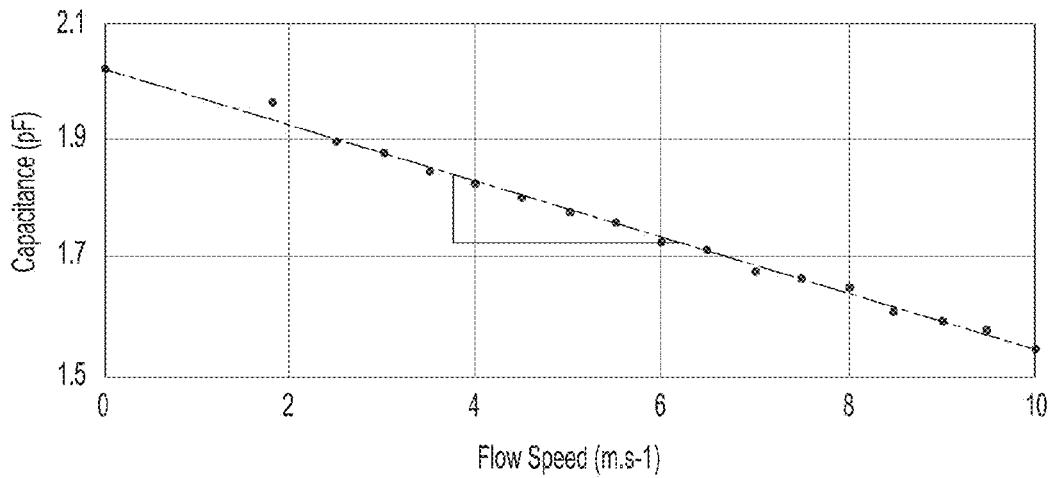
FIG. 12D is a graph depicting capacitance change with air flow speed for the micro-hydraulic device depicted in FIG. 12A.

Additionally, by utilizing an optimally designed integrated hair-boss structure the sensitivity of the HAFS may be improved. Test results indicate that the HAFS has an almost linear capacitance change with air flow speed as shown in FIG. 12D and the extrapolated minimum detectable flow speed is about 1.7 mm·s$^{-1}$ (millimeters per second). A full-scale range of greater than 15 m·s$^{-1}$ (not shown) and maximum sensitivity of 47.9 fF/m·s$^{-1}$ are observed. This is more than ten times of previously reported sensitivity of 3.9 fF/m·s-1 achieved using the structure depicted in FIG. 2A.

Table III below summarizes the micro-hydraulic HAFS example shown in FIG. 12A.

TABLE III

| | |
|---|---|
| Supply voltage | 3.3-5 V |
| Range | 0-15< m · s$^{-1}$ |
| Sensitivity | 47.9 fF/(m · s$^{-1}$) |
| Speed resolution | ~1.7 mm · s$^{-1}$ |
| Range/Resolution ratio | 78.9 dB |
| Angular resolution | ~13° |
| Output | I$^2$C |
| Bandwidth | 50-70 Hz |
| Power | 3.5 mW 2 μm |
| Weight (with ckt.) | 1.2-1.5 g |

Figure 13:
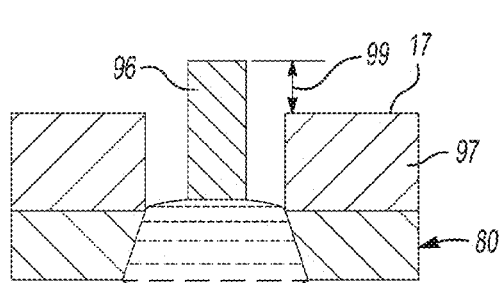
FIG. 13 depicts a pin in a perforated casing over a micro-hydraulic structure.
Figure 14:
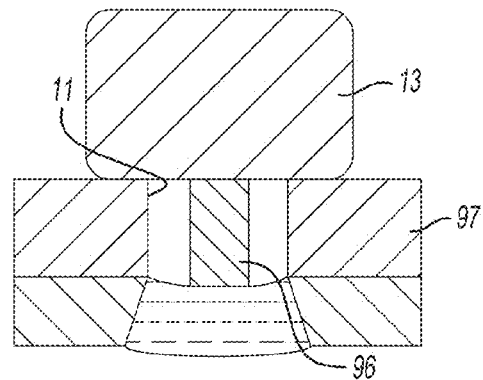
FIG. 14 depicts the pin and casing of FIG. 13 with the pin depressed by an external sample.

FIG. 13 and FIG. 14 together depicts a pin 96 in a perforated casing 97 over a micro-hydraulic structure 80 according to the present disclosure. The example depicted in FIGS. 13 and 14 may be used for a high density tactile sensor array. In FIG. 13, a pin 96 is shown indicating the maximum allowed deflection, defined by the excess height 99 of the pin 96 above the top surface 17 of the casing 97. The pin 96 projects above the top surface 17 of the casing 97. In FIG. 14, an exterior sample 13 is shown pressing down on the pin 96 in a maximum constrained deflection due to the exterior sample 13 being larger than the upper opening 11 of the casing 97. Thus, in the example depicted in FIG. 14, the deflection is constrained to be within a predetermined amount. Transduction of force is done through integrated electrode pairs 50 (see e.g., FIG. 10A) within the micro-hydraulic structure 80.

Figure 15:
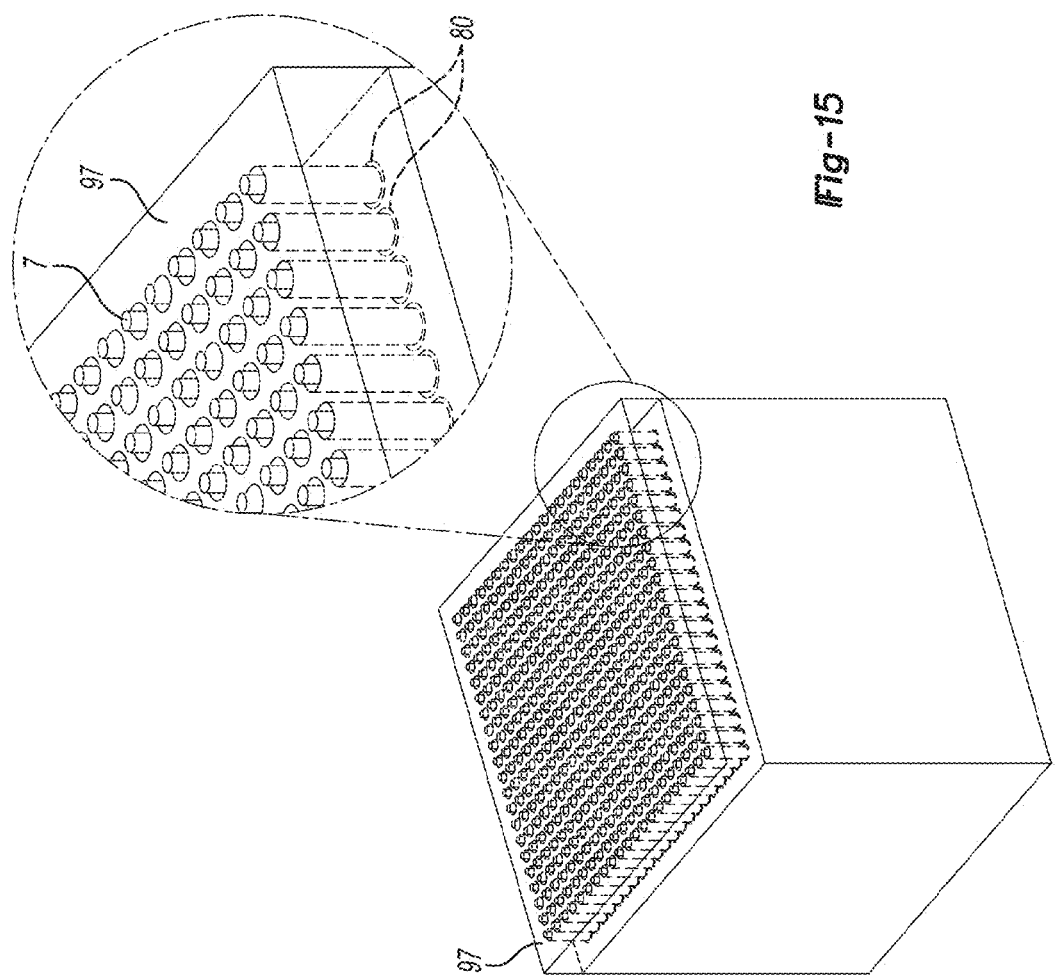
FIG. 15 depicts pin arrays mounted on a micro-hydraulic array, the pin array with a casing, and a magnified view of the pins passing through the casing over the micro-hydraulic array.
Figure 15:
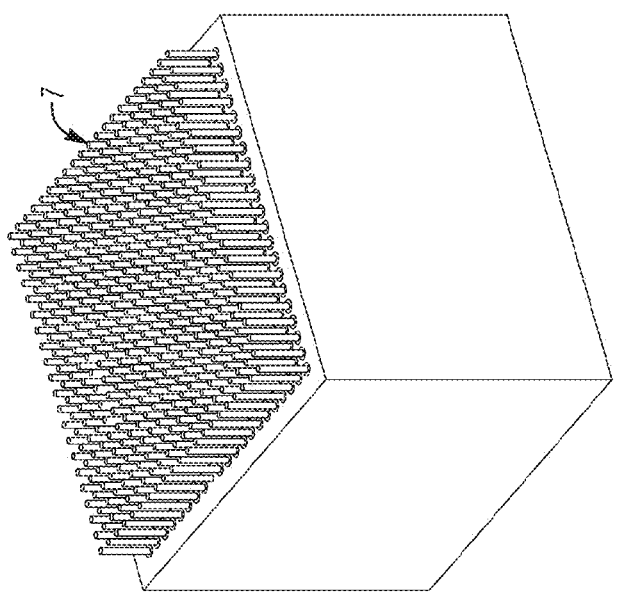

FIG. 15 depicts examples of a dense pin array 7; the pin array 7 with casing 97; and a zoomed in view of the pins 96 passing through the casing 97 according to the present disclosure. It is to be understood that an example of the array depicted in FIG. 15 may be used to make a skin-like force sensor array having each of the pins 96 connected to a corresponding cell/micro-hydraulic structure 80 on a dense array of the micro-hydraulic structures 80. Each cell 80 in the dense array is an example of the device depicted in FIG. 13 and FIG. 14.

Figure 16:
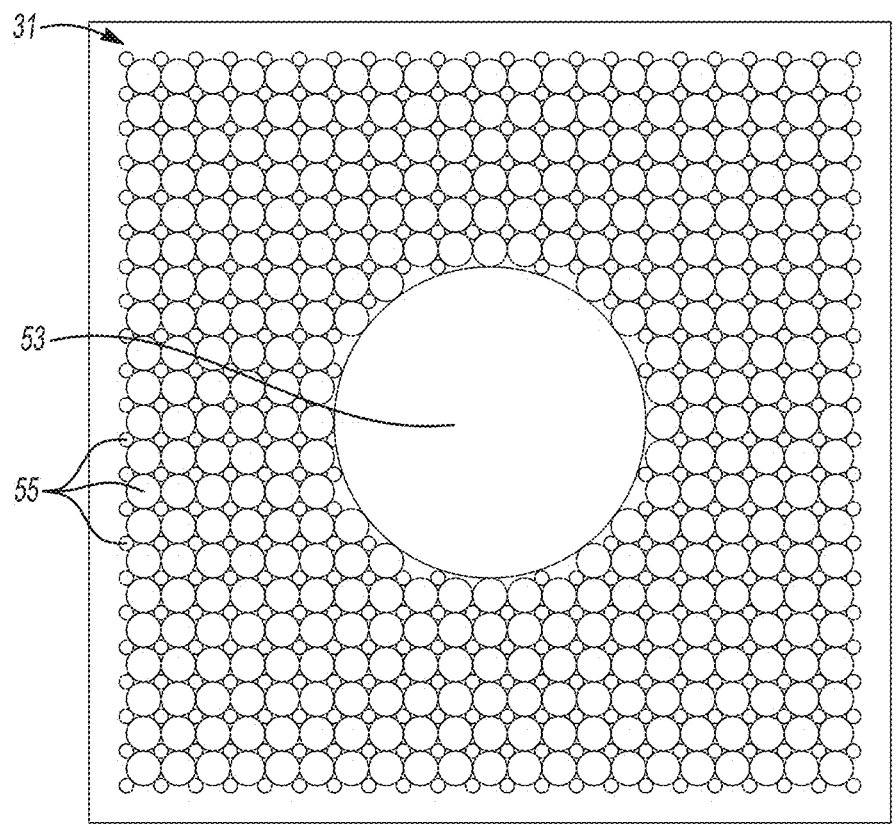
FIG. 16 depicts an example of a perforated electrode.

FIG. 16 depicts an example of a perforated rigid electrode 31.

Figure 17:
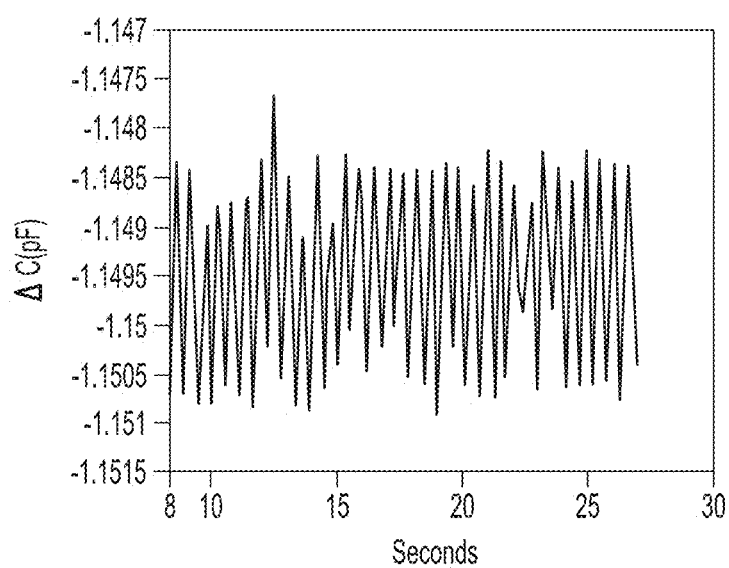
FIG. 17 depicts the results of testing indicating sensitivity of micro-hydraulics to inertial force.

FIG. 17 depicts the results of testing indicating sensitivity of micro-hydraulics to inertial force. The device is inserted over a shake table at t=7 s, acceleration is about 0.8 g. The device has shown inertial sensitivity of 3 fF/g.

Examples of the present disclosure include, but are not limited to: an accelerometer; a gyroscope (including mass based, resonant and vibration mode, including Haltere structures); a temperature sensor; a humidity sensor; and a chemical sensor.

Figure 18:
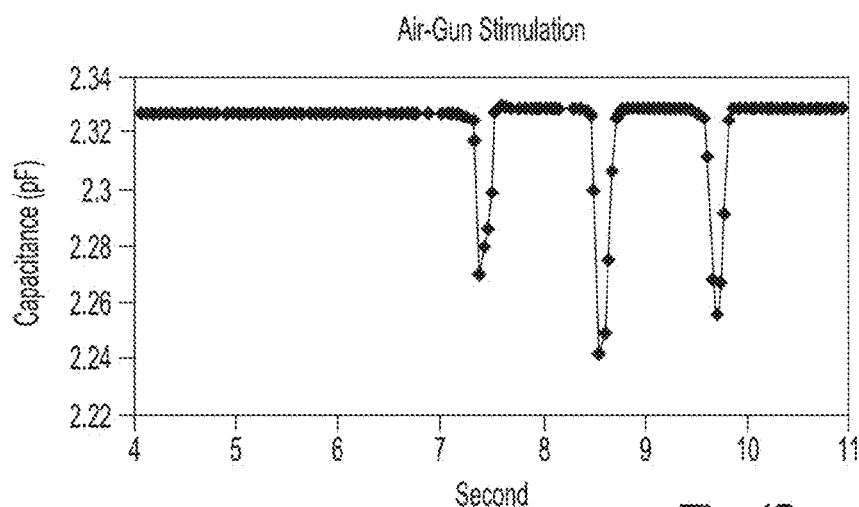
FIG. 18 depicts a response of an example according to the present disclosure.
Figure 19:
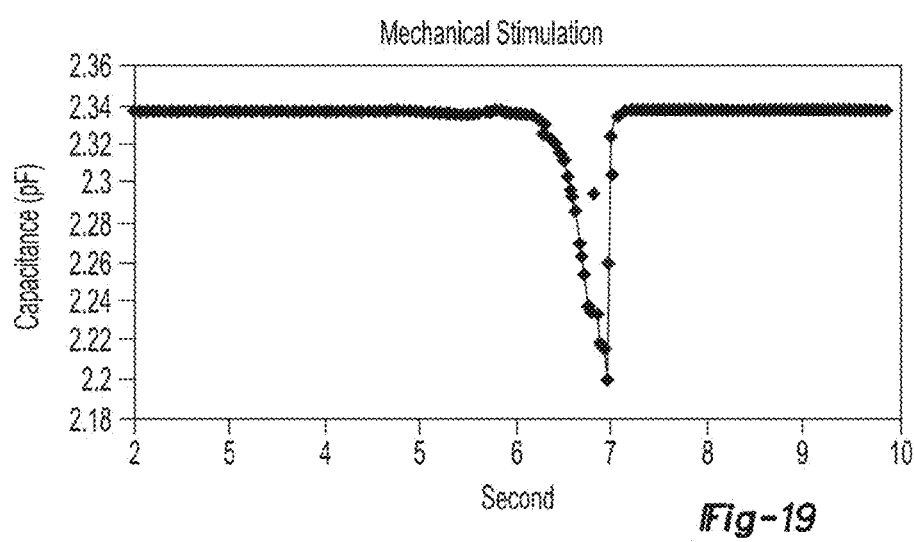
FIG. 19 depicts a response of an example of the present disclosure to a mechanical touch.
Figure 20:
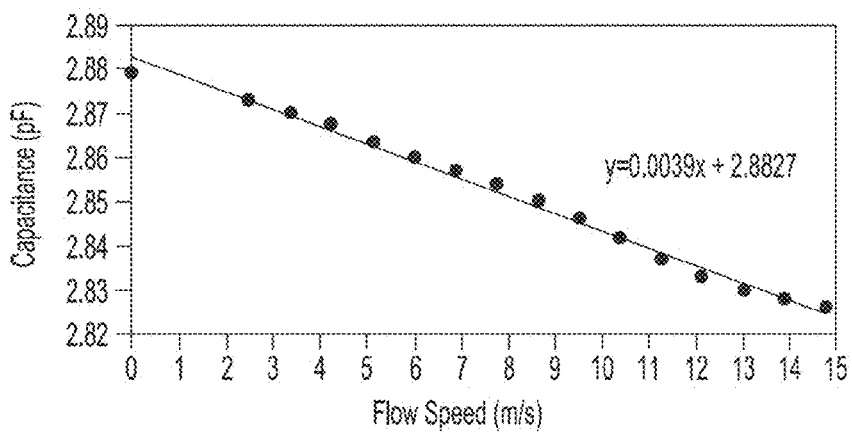
FIG. 20 depicts test results for an example showing capacitance change versus flow speed.

Examples of sensors according to the present disclosure have demonstrated a fast, linear response to air flow over a large dynamic range. See, for example, the test results in FIG. 18, FIG. 19, and FIG. 20. FIG. 18 depicts a response of the hair sensor to an air stream blown on the sensor. FIG. 19 depicts a response to a mechanical touch on the hair tip. In both FIGS. 18 and 19, the capacitance to digital convertor (CDC) sample rate is approximately 60 Hz for data point spacing of 16-17 ms. FIG. 20 depicts test results for an example showing capacitance change versus flow speed. As shown in FIG. 20, the sensor response is linear throughout the tested range.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that use of the words "a" and "an" and other singular referents may include plural as well, both in the specification and claims, unless the context clearly indicates otherwise.

Further, it is to be understood that the ranges provided herein include the stated range and any value or sub-range within the stated range. For example, a range of about 30 Hz to about 70 Hz should be interpreted to include not only the explicitly recited limits of about 30 Hz to about 70 Hz, but also to include individual values, such as 33 Hz, 48 Hz, 52 Hz, etc., and sub-ranges, such as 32 Hz to about 65 Hz, 45 Hz to about 55 Hz, etc. Furthermore, when "about" or "approximately" or the like is/are utilized to describe a value, this is meant to encompass minor variations (up to +/−10%) from the stated value.

Still further, it is to be understood that the terms "connect/connected/connection" and/or the like are broadly defined herein to encompass a variety of divergent connected arrangements and assembly techniques. These arrangements and techniques include, but are not limited to (1) the direct communication between one component and another component with no intervening components therebetween; and (2) the communication of one component and another component with one or more components therebetween, provided that the one component being "connected to" the other component is somehow in operative communication with the other component (notwithstanding the presence of one or more additional components therebetween).

While several examples have been described in detail, it will be apparent to those skilled in the art that the disclosed examples may be modified. Therefore, the foregoing description is to be considered non-limiting.

What is claimed is:

1. A micro-hydraulic device, comprising:
   an enclosure having:
      a substrate having a first surface and a second surface distal to the first surface;

a chamber defined between the first surface and the second surface defined by a wall substantially from the first surface to the second surface;

a first flexible membrane sealingly connected to the first surface and disposed over the chamber; and a second flexible membrane sealingly connected to the second surface disposed over the chamber distal to the first flexible membrane;

an internal fluid retained within the enclosure;

a rigid electrode fixed within the chamber, the rigid electrode defining at least one aperture; and a flexible electrode disposed on the second flexible membrane opposite the rigid electrode.

2. The device as defined in claim 1 wherein the flexible electrode is disposed on an outside surface of the second flexible membrane, wherein the outside surface is opposite an inside surface of the second flexible membrane in contact with the internal fluid.

3. The device as defined in claim 1 wherein a cross-section taken through the chamber parallel to the first surface has a constant area for all locations between the first surface and the second surface.

4. The device as defined in claim 1 wherein the wall is a tapered wall and the chamber has a diverging cross-sectional area from the first surface to the second surface.

5. The device as defined in claim 1 wherein the at least one aperture includes a central aperture and a plurality of peripheral apertures.

6. The device as defined in claim 1, further comprising a boss disposed on any of the first flexible membrane or the second flexible membrane, wherein the boss is stiffer than the respective first flexible membrane or second flexible membrane.

7. The device as defined in claim 6 wherein:
the boss is disposed on an external surface of the respective first flexible membrane or second flexible membrane opposite the chamber;
the external surface is opposite an internal surface of the respective first flexible membrane or second flexible membrane; and
the internal surface is in contact with the internal fluid.

8. The device as defined in claim 6 wherein the boss is disposed on an internal surface of the respective first flexible membrane or second flexible membrane opposite the chamber, wherein the internal surface is in contact with the internal fluid.

9. The device as defined in claim 6, further comprising an appendage connected to the boss to apply an input force to the boss wherein the input force is in response to a physical stimulation applied on the appendage.

10. The device as defined in claim 9 wherein the appendage is disposed within the enclosure.

11. The device as defined in claim 9 wherein the appendage is disposed outside the enclosure.

12. The device as defined in claim 9 wherein the appendage is to receive tactile force input.

13. The device as defined in claim 9 wherein the appendage is to receive a drag force from interaction with a moving environmental fluid in contact with the appendage.

14. The device as defined in claim 13 wherein the appendage has a sail shape, a mushroom shape, a chevron-shape, a T-shape, an X-shape, a square shape, a rectangle shape, or a cylinder shape.

15. The device as defined in claim 9 wherein the appendage is captivated by the device.

16. The device as defined in claim 9 wherein the appendage is captivated by a captivating structure attached to the substrate.

17. The device as defined in claim 16 wherein the appendage has a flange to cooperate with a recess defined in the captivating structure attached to the substrate.

18. An array of micro-hydraulic devices, comprising:
a plurality of the devices as defined in claim 9 having a common substrate arranged in an array; and
a network of electrical conductors disposed on the common substrate to address the rigid electrodes and the flexible electrodes wherein the appendages are arranged in an array.

19. The array of micro-hydraulic devices as defined in claim 18 wherein at least one appendage is mechanically connected to at least one other appendage.

20. The array of micro-hydraulic devices as defined in claim 18 wherein at least one device in the plurality of the devices is different from an other device in the plurality of the devices.

21. The device as defined in claim 1, further comprising at least one of a first pocket defined on the first surface having a first recessed surface recessed from the first surface, and a second pocket defined on the second surface having a second recessed surface recessed from the second surface wherein the first pocket and the second pocket are in fluid communication with the chamber.

22. The device as defined in claim 1 wherein the internal fluid is substantially incompressible.

23. The device as defined in claim 1 wherein the device is operably an actuator or a sensor.

24. The device as defined in claim 1 wherein the internal fluid is electro-chemically active.

* * * * *